United States Patent [19]

Park

[11] Patent Number: 4,678,686

[45] Date of Patent: Jul. 7, 1987

[54] TREATMENT OF FORMALDEHYDE-CONTAINING WOOD PANEL PRODUCTS

[76] Inventor: David W. Park, 1446 Heather Ct., Puyallup, Wash. 98372

[21] Appl. No.: 852,370

[22] Filed: Apr. 15, 1986

[51] Int. Cl.[4] .......................... B05D 1/18; B05D 3/00; C23C 16/00

[52] U.S. Cl. .................................... 427/254; 427/297; 427/440; 428/541

[58] Field of Search ............... 427/254, 297, 298, 341, 427/342, 446; 428/541

[56] References Cited

U.S. PATENT DOCUMENTS

| | | | |
|---|---|---|---|
| 3,008,205 | 11/1961 | Blaies, Jr. | 22/193 |
| 3,832,107 | 8/1974 | Cox et al. | 425/78 |
| 4,225,637 | 9/1980 | Richardson | 427/297 |
| 4,255,102 | 3/1981 | Smedberg et al. | 425/74 |
| 4,259,378 | 3/1981 | Richardson | 427/297 X |
| 4,376,807 | 3/1983 | Cannon et al. | 428/528 |
| 4,397,756 | 8/1983 | Lehmann | 252/182 |

OTHER PUBLICATIONS

"FD-EX Chamber: Alternative to the Formaldehyde Dilemma", *Plywood & Panel Magazine,* Apr., 1981.

*Primary Examiner*—Michael R. Lusignan
*Attorney, Agent, or Firm*—Kolisch, Hartwell & Dickinson

[57] ABSTRACT

A process for treating wood panels is disclosed where the panels are placed in a closed treatment chamber and the chamber then evacuated. This removes free formaldehyde from panel pores and produces a subatmospheric pressure within the pores. The chamber is then pressurized with an ammonia and air mixture with ammonia in the mixture permeating the panel pores and reacting with free formaldehyde. The chamber is then evacuated to recover unreacted ammonia.

10 Claims, 1 Drawing Figure

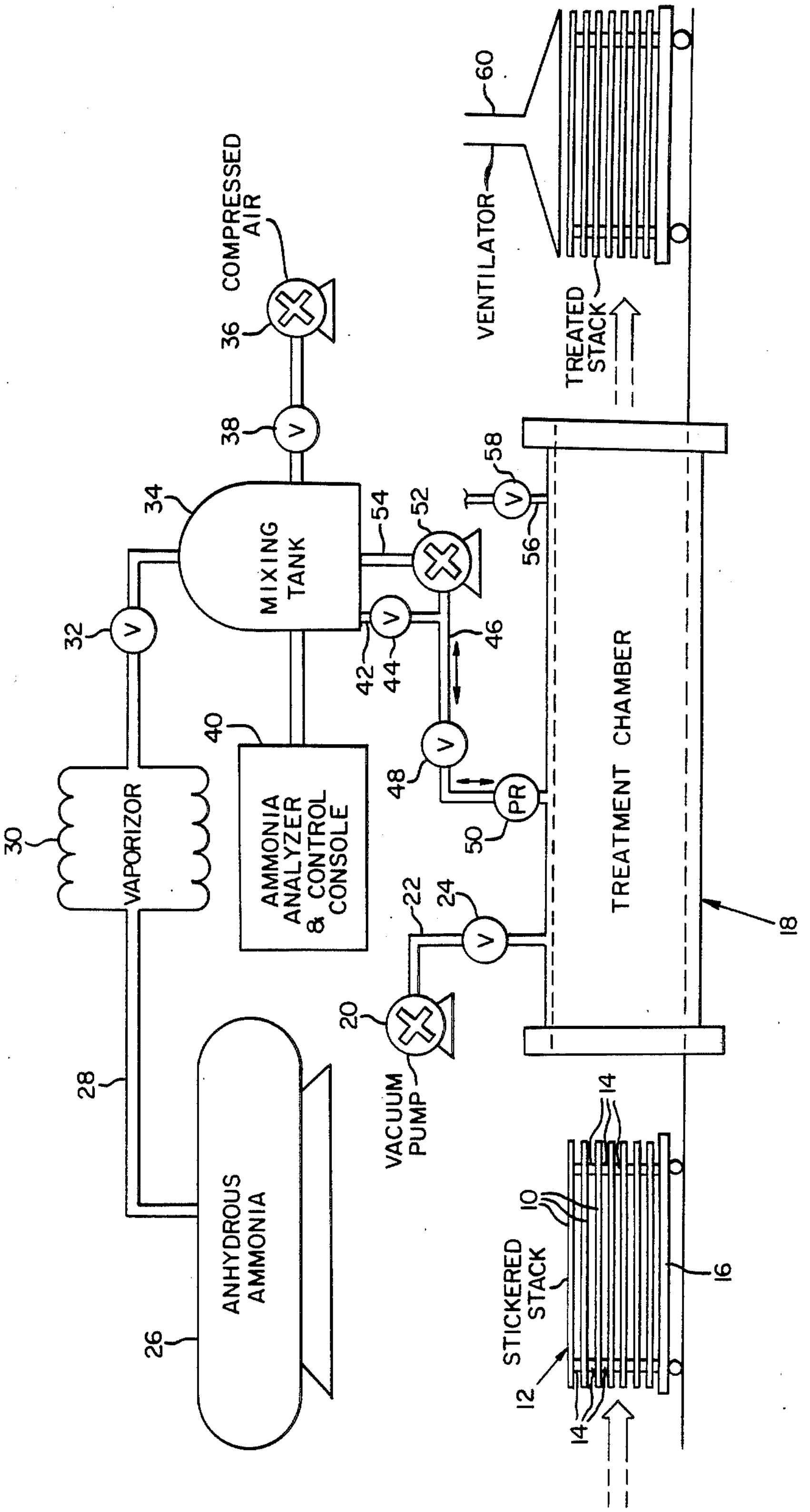
COMPRESSED AIR
36
38
34
MIXING TANK
54
52
58
56
VENTILATOR
60
TREATED STACK
32
VAPORIZOR
30
40
AMMONIA ANALYZER & CONTROL CONSOLE
42
44
46
48
PR
50
22
24
TREATMENT CHAMBER
18
20
VACUUM PUMP
28
ANHYDROUS AMMONIA
26
STICKERED STACK
12
10
14
16

TREATMENT OF FORMALDEHYDE-CONTAINING WOOD PANEL PRODUCTS

BACKGROUND AND SUMMARY OF THE INVENTION

This invention relates to the treatment of formaldehyde-containing wood products to control the emission of formaldehyde therefrom.

Wood panels, as the term is used herein, includes panels such as plywood panels, particle board panels, wafer board panels, fiberboard panels, etc., made up of wood veneer, particles, fibers, or wafers adhered together with a suitable resin-based adhesive. Resins commonly used in the manufacture of such panels comprise phenol-formaldehyde resins, which are the condensation products of phenol and formaldehyde, and ureaformaldehyde resins, which are the condensation products of urea and formaldehyde. Of the two resins mentioned, ureaformaldehyde resins are probably the most widely used in the manufacture of panels for interior use, by reason of their ready availability and their low cost.

A disadvantage associated with the use of a formaldehyde-based resin, and particularly with ureaformaldehyde condensation resins, is a tendency for panels made therefrom to release or emit free vaporous formaldehyde which, even in relatively small concentrations, is an irritant, and is suspected by some to be hazardous to the health of humans. A need, therefore, has arisen for a practical and economical process for treating formaldehyde-containing panels in such a manner as to remove or neutralize free formaldehyde, thereby to reduce and control formaldehyde emissions from the panel.

In the past, various proposals have been made for the handling of formaldehyde emissions. Exemplary of these is the so-called Verkor system, which utilizes a nonpressurized treatment chamber through which panels are carried while resting on a conveyor. An ammonia and air mixture within the chamber is absorbed by panel surfaces. The ammonia reacts with free formaldehyde in the panels to produce hexamethylenetetramine or, as is more commonly known, hexamine, thus to neutralize the formaldehyde. The process tends to be slow, thus making it difficult to keep up with panel production rates in a plant. There is limited penetration of the ammonia into panel surfaces, so that even after treatment, formaldehyde emissions tend to be higher than would be desirable.

In U.S. Pat. No. 4,376,807, a method is disclosed wherein an aqueous solution of an ammonium salt is coated on the sides of panels being treated. The process requires, in addition to the physical act of forming the coating, a subsequent forming of a barrier over a treated surface to minimize loss of vaporous ammonia to the atmosphere, and further requires a subsequent drying operation. The barrier-forming and drying steps add to the problems of manufacture, and panel appearance and properties are changed by reason of the water which is applied when applying the coating.

In U.S. Pat. No. 4,255,102, a process is disclosed where a vacuum is applied to the underside of a panel which serves to draw ammonia through the panel. With such a process, one side of the panel tends to have greater ammonia exposure than the other and leakage or bypassing of ammonia may occur. Optimum, results are realized when individual panels are processed separately, rather than collectively as in a stack, which results in the treatment process being relatively slow.

A general object of this invention is to provide an improved process for treating panels for controlling emissions in panels which may be rapidly and efficiently performed, and which lends itself, therefore, to the in-line treatment of panels as they are manufactured in the usual plant or mill.

Another general object is to provide a process for sotreating panels, which results in panels having free-formaldehyde levels which are significantly lower than those attainable by conventional approaches.

A further object is to provide a process for lowering formaldehyde levels in panels which utilizes ammonia gas as an impregnant and for neutralizing free formaldehyde, under conditions whereby there is minimal escapage of ammonia gas into the work area.

A further object is to provide a process for panel treatment which relies initially on an evacuation step, which is effective to remove free formaldehyde and other vapors such as vaporous moisture, and to produce a subatmospheric pressure condition within the panel pores. With this condition reached, gaseous ammonia is introduced about the panel, and at a superatmospheric pressure, with such then permeating the previously evacuated panel pores and converting any remaining free formaldehyde into a tetramine residual.

In a specific and preferred embodiment of the invention, after the treatment with pressurized ammonia, the panel is then subjected to another evacuation step which removes unreacted ammonia, the ammonia so removed being recovered and usable in subsequent panel treatments.

To realize optimum treatment rates, multiple panels may be processed simultaneously where the panels are positioned side-by-side and with spaces between adjacent panels, as in a spaced stack, the spacing permitting sub- and superatmospheric conditions to be established over opposite faces of respective panels.

These and other objects and advantages are obtained by the invention, which is described below in conjunction with the accompanying drawing, which is a schematic illustration of equipment utilizable in practicing the invention.

Panels treatable according to the invention are porous wood panels, as exemplified by plywood or particleboard panels, where the wood particles or components of the panels have been adhered together with an adhesive which includes a formaldehyde condensation product, such as a urea-formaldehyde resin. By reason of the adhesive employed, the panels may contain an unacceptable level of free formaldehyde which must be reduced if emissions are to be controlled. Panels of this description are illustrated in the drawing at 10. To obtain an optimum rate of production, multiple panels are processed at one time with such during processing being in a side-by-side, spaced relationship. This can be accomplished by arranging the panels as the stickered stack shown at 12, where adjacent panels are spaced from each other with stickers 14 and with the stack resting on a wheeled cart 16. As an alternative to stickers, the panels may be placed on a suitable rack structure which provides the desired spacing between the panels.

Optimum results are obtained where there is a spacing between all panels, but with relatively thin panels, adequate results may be obtained where there is a spacing only; for instance, between every other panel in the stack.

During treatment, the panels are subjected to evacuation and pressurizing steps and, for this purpose, a pressure vessel such as is shown at 18 is provided, with walls defining an internal treatment chamber, and which is openable at one or both ends to provide for the movement of a stack into and out of the vessel.

To evacuate the vessel, and when the contents of the vessel is to be evacuated to the atmosphere, a vacuum pump 20 is provided connecting with vessel 18 through line 22 and valve 24.

The treatment process contemplated utilizes ammonia, more specifically, a mixture of ammonia and air, to convert free formaldehyde within the wood pores or interstices to a relatively stable hexamine residual within the pores of the wood. Toward these ends, a source of ammonia is provided, as exemplified by tank 26 containing liquid anhydrous ammonia under pressure. Tank 26 is connected by line 28, vaporizer 30, and through valve 32 to a mixing and storage vessel or tank 34. Atmospheric air is introduced into tank 34 to produce a proper mixture of ammonia and air, utilizing compressor 36 and valve 38. A control console 40 provides a means for monitoring the conditions within vessel 34.

Extending from vessel 34 is a line 42 provided with a valve 44 which connects with a line 46. Line 46, in turn, connects through a valve 48 and a pressure relief valve 50 to pressure vessel 18. This structure is utilized in introducing an ammonia and air mixture under pressure to the pressure vessel and establishing a superatmospheric pressure with such mixture at a predetermined level in the vessel.

After pressure treatment, the pressure vessel is evacuated for the purpose of removing unreacted ammonia. The gas so-removed from the vessel is returned to storage vessel 34 utilizing pump 52 and line 54.

Connecting with pressure vessel 18 is a line 56 equipped with a valve 58. The valve is opened to provide for the flow of atmospheric air into the vessel for the purpose of reestablishing atmospheric pressure therein.

After treatment, the panels of the stack are subjected to ventilation with circulated air serving to further remove any remaining ammonia from the treated panels. In the drawing, the ventilator is designated at 60.

Describing the process of the invention, as such is practiced utilizing the equipment described, after preparation of the stack of panels, the stack is moved into pressure vessel 18 and the pressure vessel then closed to produce a closed treatment chamber. The chamber is then evacuated utilizing pump 20, typically to a pressure within the range of 20" Hg to 28" Hg, and preferably around 22" Hg. The vacuum is then maintained for typically two minutes with particleboard having a density of around 40 pounds, but a longer period may be used with boards of greater density.

The establishment and maintenance of a vacuum within the chamber results in gases or vapors being removed from the pores of the panels, including free formaldehyde. Moisture, if present, is also removed.

With gaseous ammonia utilized in the process preferably being recycled, the evacuation also has the effect of reducing contaminants in the recycled ammonia. The removal of air also prevents possible air buffer zones from being created between adjacent panels in a subsequent pressurization step, which is detrimental. Further, the evacuation produces a negative pressure within panel pores.

At the conclusion of the evacuation step, a mixture of gaseous ammonia and air is introduced into vessel 18, with the establishment by such introduction of a superatmospheric pressure within the vessel. The percentage, on a volume basis, of ammonia in the mixture is maintained preferably within the range of about 26% to 45%, with a percentage of ammonia of about 40% typically being used. Where a greater percentage of ammonia is employed, water-soak properties in treated panels are effected, and furthermore, there is a tendency for discoloration to occur in panel faces. With a percentage of ammonia below the range indicated, the efficacy of the process is effected and mixtures tending to have an explosive character result.

Pressures utilized are preferably within the range of 15 to 30 PSIG. With pressures below the range indicated, penetration of the panels is affected. Pressures above that indicated complicate the construction of the equipment utilized in the process.

The pressure in the vessel is maintained for typically about two minutes, although with higher density materials, a pressure of treatment up to fifteen minutes may be indicated.

As the result of the pressure treatment, the gaseous ammonia is forced into the previously evacuated pores of the wood. The ammonia, by reaction with free formaldehyde remaining in the pores, converts the formaldehyde to a relatively stable hexamine residual.

After the pressure treatment, the ammonia remaining in the vessel is removed and returned to storage vessel 34 utilizing pump 52. The removal serves to recreate a vacuum within vessel 18. The vacuum applied serves to remove ammonia trapped within panel pores, and results in vaporization and removal of any ammonia that may have dissolved in the moisture of the panels.

At the conclusion of this second evacuation step, which may, as in the first step, be maintained for approximately two minutes, the chamber is restored to atmospheric pressure utilizing valve 58. With opening of the pressure vessel, the stack of panels is moved from vessel 18 to the station including ventilator 60, where air circulating over the faces of the panels is effective to remove final traces of ammonia.

With some pump equipment it may be desirable to evacuate the ammonia in a vessel with initial evacuation using pump 52 to produce a vacuum level which is somewhat less than the ultimate vacuum level desired. The final evacuation may be performed using pump 20, and directing, if desired, the material evacuated, instead of into the atmosphere, into a scrubber or other equipment detachably connectible with the exhaust of pump 20.

It will be noted from the description of the process that use of ammonia is done in a controlled manner which substantially eliminates discharge of any substantial amounts into the atmosphere. Unreacted ammonia remaining after one pressurization step is removed and recycled with the pressure treatment of a succeeding batch of panels.

Typical tests of panels treated with the present invention show reduction of formaldehyde levels to below 45 μg/ml as determined by the National Particleboard Association two hour desiccator tests. The following table sets forth results obtained in the treating of panels supplied by three different manufacturers. In the table, in the column entitled "Treatment Cycle", the times set forth for a given panel are the time that the initial vacuum was maintained in the treatment chamber and the time that the chamber was maintained under pressure utilizing the ammonia-air gas mixture. The table also sets forth the free-formaldehyde level in the panels before and after treatment.

| MANUFACTURER | TREATMENT CYCLE | INITIAL LEVEL | FINAL LEVEL |
|---|---|---|---|
| A | 2 min Vac, 2 min Press | 1.67 μg/ml | 0.24 μg/ml |
| B | 6 min Vac, 6 min Press | 1.43 μg/ml | 0.21 μg/ml |
| C | 30 sec Vac, 1 min Press | 1.70 μg/ml | 0.21 μg/ml |

There have been described above an apparatus and a method for treating formaldehyde-containing wood panels according to a specific embodiment of the invention. Obviously, changes and variations are possible and treatment conditions are variable depending upon the specifics of the panels being processed. It is desired to cover all such modifications and variations as such may be incorporated with the practice of the disclosed invention.

It is claimed and desired to secure by Letters Patent:

1. A process for treating a porous formaldehyde-containing wood panel to control formaldehyde emissions from the panel comprising:

placing the panel in a chamber and with closing of the chamber evacuating the chamber to establish a subatmospheric pressure therein, with the evacuation removng atmospheric gases from the chamber and gases from the pores of the panel including free formaldehyde and further producing a subatmospheric pressure within these pores, then introducing gases ammonia into the evacuated chamber and with such introduction establishing a superatmospheric pressure therein, and with the superatmospheric pressure established permeating the panel pores with ammonia and reacting ammonia with a residual formaldehyde to convert the formaldehyde to a relatively stable hexamine residual.

2. The process of claim 1, whcih further includes after establishing the superatmospheric pressure with the introduction ofthe gaseous ammonia, in a subsequent evacuation evacuating the chamber to remove ammonia not reacted with formaldehyde in the wood panel.

3. The method claim 2, wherein after said subsequent evacuation, air is introduced into the chamber to restore atmospheric pressure, and the panel after removal from the chamber is ventilated with opposite faces thereof exposed to air.

4. The process of claim 2, wherein the ammonia removed during said subsequent evacuation is collected and recycled as at least part of the gaseous ammonia introduced into the chamber to estalbish a superatmospheric pressure in the processing of a subsequent panel.

5. The process of claim 2, wherein the subsequent evacuation performed with recycling of the removed ammonia, and the next evacuation performed with exhaust of ammonia to another location.

6. The process for treating a porous formaldehyde-containing wood panel to control formaldehyde emissions therefrom comprising:

placing the panel in a chamber and after closing of the chamber evacuating the chamber to establish a vacuum therein of at least about 20" Hg, with the evacuation removing atmospheric gases from the chamber and gases from the pores of the panel including free formaldehyde and producing a subatmospheric pressure within these pores, then introducing a gseous ammonia and air mixture into the chamber to establish by such introduction a superatmospheric pressure therein, the ammonia and air mixture containing from 26% to 45% ammonia, and with the superatmospheric pressure estalbished permeating the panel pores with ammonia and reacting ammonia with residual formaldehyde to convert such into a relatively stable hexamine residual, and after introduction of the ammonia and air mixture in a subsequent evacuation evacuating the chamber to remove ammonia not reacted with formaldehyde.

7. The process of claim 6, wherein the ammonia and air mixture is stored upon removal and recycled in the processing of a subsequent panel.

8. A process for treating formaldehyde-containing porous wood panels to control formaldehyde emissions therefrom which comprises:

establishing within a chamber a stack of the panels with the panels in the stack spaced from each other and with the space between adajcent panels communicating with the chamber interior and after establishing the stack closing the chamber, evacuating the closed chamber to establish a vacuum therein, with the evacuation removing atmospheric gas from the chamber interior and from between the panels and gas from the pores of the panels includng free formaldehyde and producing a subatmospheric pressure within these pores, introducing gaseous ammonia into the evacuated chamber and with such introduction establishing a superatmospheric pressure in the chamber, with the superatmospheric pressure established permeating the panel pores with ammonia and reacting ammonia with residual formaldehyde to convert such to a stable hexamine residual within the panel, and following the introduction of the ammonia establishing a vacuum within the chamber to remove ammonia not reacted with formaldehyde.

9. The process of claim 8, wherein the ammonia is introduced as a mixture of ammonia and air containing from about 26% to 45% ammonia.

10. The process of claim 9, wherein after the evacuation of the chamber, atmospheric pressure is reestablished in the chamber and the stack removed from the chamber, another stack of spaced panels is established in the chamber in the manner of the first-mentioned stack, and processed as recited for the first-mentioned stack, and wherein the ammonia removed in said other evacuation in the processing of the first-mentioned stack is at least in part employed as the ammonia introduced to produce a superatmospheric pressure in the chamber during processing of the second-mentioned stack.

* * * * *